(12) United States Patent  
Wang et al.

(10) Patent No.: US 7,851,793 B2  
(45) Date of Patent: Dec. 14, 2010

(54) TEST STRUCTURE WITH TDDB TEST PATTERN

(75) Inventors: Chien-Jung Wang, Hsin-Chu (TW); Ming-Zong Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 919 days.

(21) Appl. No.: 11/593,716

(22) Filed: Nov. 7, 2006

(65) Prior Publication Data

US 2008/0122476 A1 May 29, 2008

(51) Int. Cl.  
*H01L 23/58* (2006.01)  
*H01L 21/66* (2006.01)

(52) U.S. Cl. .......................... 257/48; 438/18

(58) Field of Classification Search .................. 257/48, 257/E21.521, E21.522, E21.524, E21.53; 438/11, 14, 17, 18  
See application file for complete search history.

(56) References Cited

U.S. PATENT DOCUMENTS

| | | | |
|---|---|---|---|
| 5,841,164 A | 11/1998 | Tsujino et al. | |
| 6,022,750 A | 2/2000 | Akram et al. | |
| 6,339,229 B1 | 1/2002 | Shiga et al. | |
| 6,351,135 B1 | 2/2002 | Kim | |
| 6,774,394 B2 * | 8/2004 | Wang | 257/48 |
| 6,781,401 B2 | 8/2004 | Kim | |
| 6,967,499 B1 | 11/2005 | Haase et al. | |
| 7,078,920 B2 * | 7/2006 | Okajima | 324/719 |
| 7,355,201 B2 * | 4/2008 | Zhu et al. | 257/48 |
| 2005/0212547 A1 | 9/2005 | Suzuki | |

* cited by examiner

*Primary Examiner*—Hung Vu  
(74) *Attorney, Agent, or Firm*—Slater & Matsil, L.L.P.

(57) ABSTRACT

A test structure includes a time dependent dielectric breakdown (TDDB) test pattern formed in a dielectric material on a wafer. The test pattern includes first and second conductive lines formed in the dielectric material. The second conductive line is adjacent to the first conductive line. The first conductive line and the second conductive line are separated by a first minimum distance at a first portion of the TDDB test pattern. The first conductive line and the second conductive line are separated by a second minimum distance at a second portion of the TDDB test pattern. The second minimum distance is greater than the first minimum distance. The second portion is different than the first portion. It also may have a third different portion with a third larger minimum distance between the first and second conductive lines. The TDDB test pattern may have a comb-comb or a comb-serpent structure, for example.

20 Claims, 3 Drawing Sheets

TEST STRUCTURE WITH TDDB TEST PATTERN

TECHNICAL FIELD

The present invention relates to test structures (e.g., device under testing) for quality and reliability testing of integrated circuit chips. More particularly, the present invention relates to time dependent dielectric breakdown (TDDB) testing for dielectric materials in integrated circuit chips.

BACKGROUND

As the interconnect system in the back-end of integrated circuit chips shrinks, going from one technology node to the next, the line-to-line spacing between conductive lines also continues to shrink. As such, the dielectric thickness between the lines has presently reached values on the order ranging from about 35 nm to about 90 nm. Due to the desire to lower the line-to-line capacitance to minimize the RC time response of the interconnect network, low-k dielectric materials have been introduced as inter-metal-dielectrics (IMD). However, these new insulators no longer have the dielectric-strength of pure dense amorphous silicon oxides. In most low-k dielectric materials, their lower density and the presence of weaker bonds (such as Si—C bonds) introduce charge traps, and can potentially host mobile ions. These mobile ions can aid early breakdown events under electrical stress.

In addition, the necessity for the integration of additional dielectrics films as etch-stop layers, and diffusion barriers on top of the copper metal lines, gives rise to interfaces that span between the lines and open new channels for early breakdown. Because the profile of the etched trenches is often adjusted for copper filling optimization, in the damascene process presently used by most of the integrated circuit industry, the line-to-line spacing becomes even narrower at the top of the lines. This gives rise to the occurrence of the higher electric field near the interface between the low-k dielectric material and the diffusion-barrier/etch-stop layer above it.

Near the end of the fabrication of the microelectronic device, a dielectric test is conducted to determine both the quality and reliability of the dielectric. Usually, this test involves determining the electrical breakdown field of the dielectric within test devices. The most commonly used model to predict the time to breakdown ($t_{bd}$) for silica-based dielectrics under an electric field E, states that:

$$t_{bd} = A \cdot e^{((\Delta H \gamma E)/(k_B T))}$$

where A is a constant, $\Delta H$ is the zero-field activation energy, $\gamma$ is the field-acceleration parameter (which may be associated with the Si—O bond dipole moment that interacts with the electric field to lower the bond strength), $k_b$ is the Boltzmann constant, and T is the temperature in Kelvin.

For a given temperature T, $\gamma(T)$ typically can be extracted from a series of time dependent dielectric breakdown (TDDB) tests. A collection of devices under test (DUTs: capacitors, comb-comb or comb-serpent test structures), which are chosen to be uniformly distributed across the wafer, are stressed at a constant voltage and the time-to-breakdown distributions are recorded. By virtue of area scalability, these distributions preferably obey Weibull statistics, for example. From the characteristic time-to-breakdown $t_{bd}(E)$, under various electric fields E, one can obtain the value of $\gamma$, and extrapolate the dielectric lifetime to operating voltage at any required confidence level.

Because TDDB tests are slow, often one cannot test a sufficient number of DUTs to obtain good enough statistics. FIGS. 1A and 1B show two conventional TDDB test patterns that a test structure may include. FIG. 1A shows a comb-comb test pattern 21. FIG. 1B shows a comb-serpent test pattern 22. Using either of the test patterns (21 or 22) of FIGS. 1A and 1B, the time to dielectric breakdown under a constant voltage can be determined. But when the dielectric breaks down using these conventional test patterns (FIGS. 1A and 1B), there is usually a serious burn-out that damages a relatively large area at and surrounding the point of initial failure. Although the time to dielectric breakdown can be measured accurately, the failure mode add characteristics of the failure is usually unobservable due to the large damage area. A need exists for a way to measure the time to failure while also providing a way to observe the failure mode and failure characteristics.

SUMMARY OF THE INVENTION

The problems and needs outlined above may be addressed by embodiments of the present invention. In accordance with one aspect of the present invention, a test structure that includes a time dependent dielectric breakdown (TDDB) test pattern formed in a dielectric material on a wafer. The TDDB test pattern includes a first conductive line and a second conductive line. The first conductive line is formed in the dielectric material. The second conductive line is formed in the dielectric material adjacent to the first conductive line. The first conductive line and the second conductive line are separated by a first minimum distance at a first portion of the TDDB test pattern. The first conductive line and the second conductive line are separated by a second minimum distance at a second portion of the TDDB test pattern. The second minimum distance is greater than the first minimum distance. The second portion is different than the first portion.

This paragraph describes some illustrative variations or embodiments of the aspect described in the immediately preceding paragraph. The first conductive line and the second conductive line may be separated by a third minimum distance at a third portion of the TDDB test pattern, where the third minimum distance is greater than the second minimum distance and the third portion is different than the first and second portions. At least part of the first conductive line may be a central conductive line that is generally square-wave shaped in a plan view of the TDDB test pattern. At least part of the second conductive line may be an upper conductive line that is located above the central conductive line in the plan view of the TDDB test pattern, where the upper conductive line being generally comb shaped in the plan view of the TDDB test pattern, and such that the upper conductive line is interleaved with the central conductive line. In such case, the upper conductive line and the central conductive line are separated by the first minimum distance at the first portion of the TDDB test pattern; the first portion extends along a longitudinal axis of the TDDB test pattern in the plan view of the TDDB test pattern; the upper conductive line and the central conductive line are separated by the second minimum distance at the second portion of the TDDB test pattern; and the second portion extends along the longitudinal axis of the TDDB test pattern adjacent the first portion in the plan view of the TDDB test pattern. A lower conductive line may be formed in the dielectric material adjacent to the central conductive line and located below the central conductive line in the plan view of the TDDB test pattern, where the lower conductive line being generally comb shaped in the plan view of the TDDB test pattern, and such that the lower conductive line is interleaved with the central conductive line. In such case, the lower conductive line and the central conductive line are separated by the first minimum distance at the first portion of the TDDB test pattern; and the lower conductive line and the central conductive line are separated by the second minimum distance at the second portion of the TDDB test pattern. As another alternative, at least part of the first conductive line is generally comb shaped in a plan view of the TDDB test pattern, and at least part of the second conductive line is generally comb shaped in the plan view of the TDDB test pattern. In such case, the first conductive line is interleaved with the second conductive line; the first portion extends along a longitudinal axis of the TDDB test pattern in the plan view of the TDDB test pattern; and the second portion extends along the longitudinal axis of the TDDB test pattern adjacent the first portion in the plan view of the TDDB test pattern. The first and second conductive lines may include any suitable conductive material, such as metal, doped polysilicon, silicide, copper, aluminum, tungsten, or combinations thereof, for example. The dielectric material also may be part of an intermetal dielectric structure of an integrated circuit chip on the wafer. The dielectric material may include a low-k dielectric material. A method of performing a TDDB test using the test structure may include: (i) applying a constant voltage over the TDDB test pattern until dielectric breakdown occurs in the dielectric material at the first portion of the TDDB test pattern; and (ii) observing the dielectric material at the second portion of the TDDB test pattern to determine a second portion dielectric breakdown location between the first conductive line and the second conductive line at the second portion of the TDDB test pattern where dielectric breakdown begins to occur in the second portion. Where the test structure has a third portion with a third minimum distance separating the first and second conductive lines, a method of performing a TDDB test using the test structure may include: (i) applying a constant voltage over the TDDB test pattern until dielectric breakdown occurs in the dielectric material at the first portion of the TDDB test pattern; (ii) observing the dielectric material at the second portion of the TDDB test pattern to determine a second portion dielectric breakdown location between the first conductive line and the second conductive line at the second portion of the TDDB test pattern where dielectric breakdown begins to occur in the second portion; and (iii) observing the dielectric material at the third portion of the TDDB test pattern to determine a third portion dielectric breakdown location between the first conductive line and the second conductive line at the third portion of the TDDB test pattern where dielectric breakdown begins to occur in the third portion.

In accordance with another aspect of the present invention, a test structure that includes a time dependent dielectric breakdown (TDDB) test pattern formed in a dielectric material on a wafer. The TDDB test pattern includes a central conductive line, an upper conductive line, and a lower conductive line. The central conductive line is formed in the dielectric material. The central conductive line is generally square-wave shaped (i.e., serpent shaped) in a plan view of the TDDB test pattern. An upper conductive line is formed in the dielectric material adjacent to the central conductive line and located above the central conductive line in the plan view of the TDDB test pattern. The upper conductive line is generally comb shaped in the plan view of the TDDB test pattern, such that the upper conductive line is interleaved with the central conductive line. The lower conductive line is formed in the dielectric material adjacent to the central conductive line and located below the central conductive line in the plan view of the TDDB test pattern. The lower conductive line is also generally comb shaped in the plan view of the TDDB test pattern, such that the lower conductive line is also interleaved with the central conductive line. The upper conductive line and the central conductive line are separated by a first minimum distance at a first portion of the TDDB test pattern. The first portion extends along a longitudinal axis of the TDDB test pattern in the plan view of the TDDB test pattern. The lower conductive line and the central conductive line are separated by the first minimum distance at the first portion of the TDDB test pattern. The upper conductive line and the central conductive line are separated by a second minimum distance at a second portion of the TDDB test pattern. The second minimum distance is greater than the first minimum distance. The second portion extends along the longitudinal axis of the TDDB test pattern adjacent the first portion in the plan view of the TDDB test pattern. The second portion is different than the first portion. The lower conductive line and the central conductive line are separated by the second minimum distance at the second portion of the TDDB test pattern. The upper conductive line and the central conductive line also may be separated by a third minimum distance at a third portion of the TDDB test pattern, the third minimum distance being greater than the second minimum distance, the third portion extending along the longitudinal axis of the TDDB test pattern adjacent the second portion in the plan view of the TDDB test pattern, the third portion being different than the first and second portions, and the lower conductive line and the central conductive line may be separated by the third minimum distance at the third portion of the TDDB test pattern.

In accordance with yet another aspect of the present invention, a test structure that includes a time dependent dielectric breakdown (TDDB) test pattern formed in a dielectric material on a wafer. The TDDB test pattern includes a central conductive line, an upper conductive line, and a lower conductive line. The central metal line is formed in the dielectric material. The central metal line has a square-wave shape extending along a longitudinal axis of the TDDB test pattern in a plan view of the TDDB test pattern. The central metal line has laterally extending wave portions. The laterally extending wave portions extend generally perpendicular to the longitudinal axis of the TDDB test pattern in the plan view of the TDDB test pattern. The upper metal line is formed in the dielectric material adjacent to the central metal line and located above the central metal line in the plan view of the TDDB test pattern. The upper metal line has a comb shape in the plan view of the TDDB test pattern. The upper metal line has upper comb teeth portions that laterally extend from an upper longitudinal comb frame portion toward the central metal line in the plan view of the TDDB test pattern, such that at least part of the upper comb teeth portions extend between a first group of the laterally extending wave portions of the central metal line. A lower metal line is formed in the dielectric material adjacent to the central metal line and located below the central metal line in the plan view of the TDDB test pattern. The lower metal line has a comb shape in the plan view of the TDDB test pattern. The lower metal line has lower comb teeth portions that laterally extend from a lower longitudinal comb frame portion toward the central metal line in the plan view of the TDDB test pattern, such that at least part of the lower comb teeth portions extend between a second group of the laterally extending wave portions of the central metal line. The upper comb teeth portions of the upper metal line and the first group of laterally extending wave portions of the central metal line are separated by a first minimum distance at a first portion of the TDDB test pattern. The first portion extending along the longitudinal axis of the TDDB test pattern in the plan view of the TDDB test pattern. The lower comb teeth portions of the lower metal line and the second group of laterally extending wave portions of the central metal line are separated by the first minimum distance at the first portion of the TDDB test pattern. The upper comb teeth portions of the upper metal line and the first group of laterally extending wave portions of the central metal line are separated by a second minimum distance at a second portion of the TDDB test pattern. The second minimum distance is greater than the first minimum distance. The second portion extends along the longitudinal axis of the TDDB test pattern adjacent the first portion in the plan view of the TDDB test pattern. The lower comb teeth portions of the lower metal line and the second group of laterally extending wave portions of the central metal line are separated by the second minimum distance at the second portion of the TDDB test pattern. The upper comb teeth portions of the upper metal line and the first group of laterally extending wave portions of the central metal line also may be separated by a third minimum distance at a third portion of the TDDB test pattern, the third minimum distance being greater than the second minimum distance, the third portion extending along the longitudinal axis of the TDDB test pattern adjacent the second portion in the plan view of the TDDB test pattern, and the lower comb teeth portions of the lower metal line and the second group of laterally extending wave portions of the central metal line may be separated by the third minimum distance at the third portion of the TDDB test pattern. The upper comb teeth portions of the upper metal line and the first group of laterally extending wave portions of the central metal line further may be separated by a fourth minimum distance at a fourth portion of the TDDB test pattern, the fourth minimum distance being greater than the third minimum distance, the fourth portion extending along the longitudinal axis of the TDDB test pattern adjacent the third portion in the plan view of the TDDB test pattern, and the lower comb teeth portions of the lower metal line and the second group of laterally extending wave portions of the central metal line may be separated by the fourth minimum distance at the fourth portion of the TDDB test pattern.

In accordance with still another aspect of the present invention, a method of performing a time dependent dielectric breakdown (TDDB) test of a dielectric material of an integrated circuit chip using a test structure including a TDDB test pattern formed in the dielectric material, is provided. The method includes electrically connecting a test probe to the TDDB test pattern, wherein the TDDB test pattern may be any of the TDDB test patterns described in the preceding four paragraphs. A constant voltage is applied over the TDDB test pattern until dielectric breakdown occurs in the dielectric material at the first portion of the TDDB test pattern. The dielectric material is observed at the second portion of the TDDB test pattern to determine a second portion dielectric breakdown location between the first conductive line and the second conductive line at the second portion of the TDDB test pattern where dielectric breakdown begins to occur in the second portion. Where the TDDB test pattern includes a third portion with a third minimum spacing between conductive lines, the method may further include a step of observing the dielectric material at the third portion of the TDDB test pattern to determine a third portion dielectric breakdown location between the first conductive line and the second conductive line at the third portion of the TDDB test pattern where dielectric breakdown begins to occur in the third portion.

The foregoing has outlined rather broadly features of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1A:
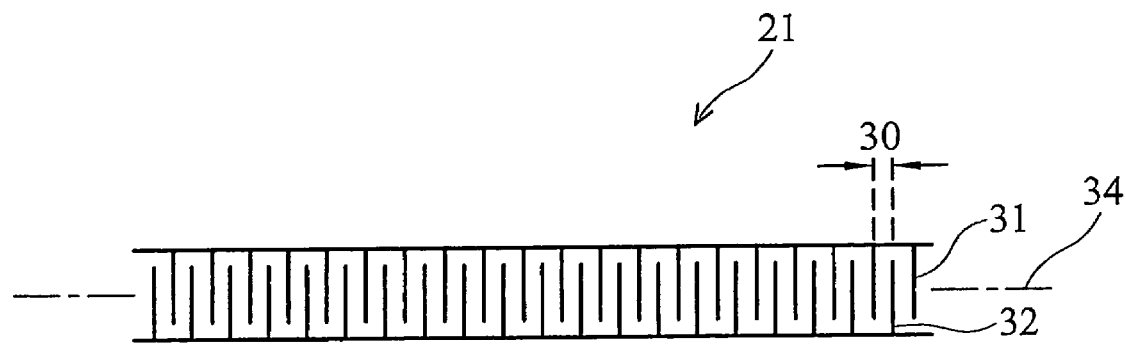
FIG. 1A is a plan view of a conventional comb-comb TDDB test pattern of a prior art test structure.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Figure 1B:
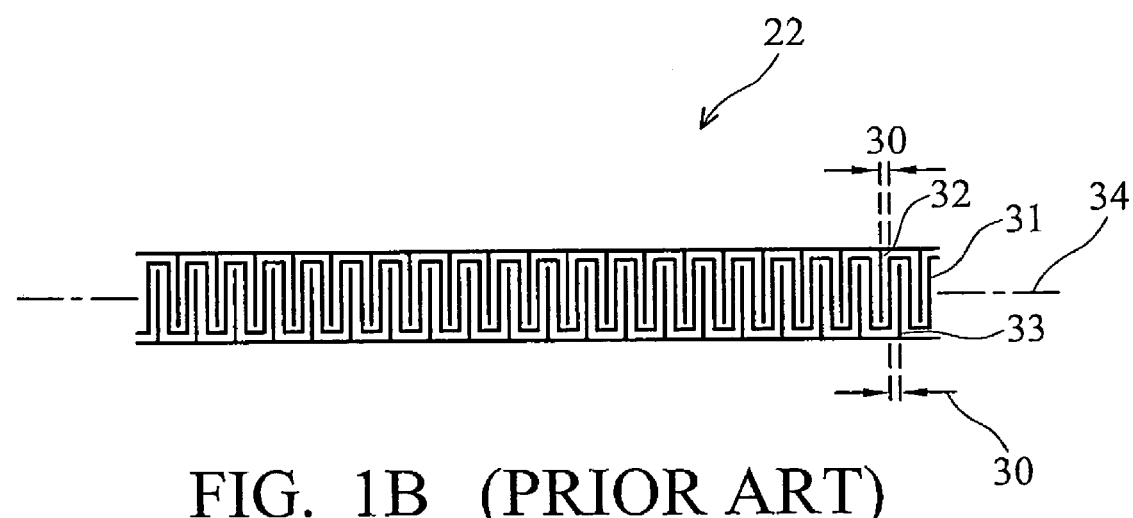
FIG. 1B is a plan view of a conventional comb-serpent TDDB test pattern of a prior art test structure.

Generally, an embodiment of the present invention provides a test structure or test device formed in dielectric material on a wafer that may be used in a time dependent dielectric breakdown (TDDB) test. As mentioned above, FIGS. 1A and 1B illustrate conventional TDDB test patterns (21 and 22) typically used in test devices (or device under testing, DUT) for TDDB testing. FIG. 1A is a comb-comb test pattern 21 forming a capacitor test structure. FIG. 1B is a comb-serpent test pattern 22 forming a differential capacitor test structure. These test structures of FIGS. 1A and 1B are used to simulate capacitance between adjacent conductive lines (e.g., interconnect lines in an intermetal dielectric layer) formed in the dielectric material for integrated circuits on the chips. Typically, such test devices are formed at the same level, from the same materials, and at the same time as conductive lines for interconnects (e.g., in an intermetal dielectric layer or IMD layer) in integrated circuits of the chips. These test structures are usually formed using the same processing steps that were used to form the interconnects and conductive lines at that level. Also, the minimum spacing between the electrodes and the size of the lines forming the electrodes of the TDDB test pattern are typically the same size and spacing (or at some range there about) as the actual conductive lines in the integrated circuits.

In the conventional test pattern 21 shown in FIG. 1A, the minimum spacing or distance 30 between the first electrode 31 (upper comb portion) and the second electrode 32 (lower comb portion) is the same along a longitudinal axis 34 of the test pattern 21. Similarly, the minimum spacing or distance 30 between the electrodes 31, 32, and 33 of the test pattern 22 of FIG. 1B is the same along the longitudinal axis 34 of the test pattern 22.

To analyze failure modes and breakdown mechanisms of the dielectric material being tested, there are often several TDDB test structures, each with a different minimum spacing between the electrodes (conductive lines). Then, each TDDB test structure is tested separately. However, this is very time consuming and consumes a lot of wafer real estate. It also requires more probes for test probe tools to contact each of the set of TDDB test structures.

Figure 2:
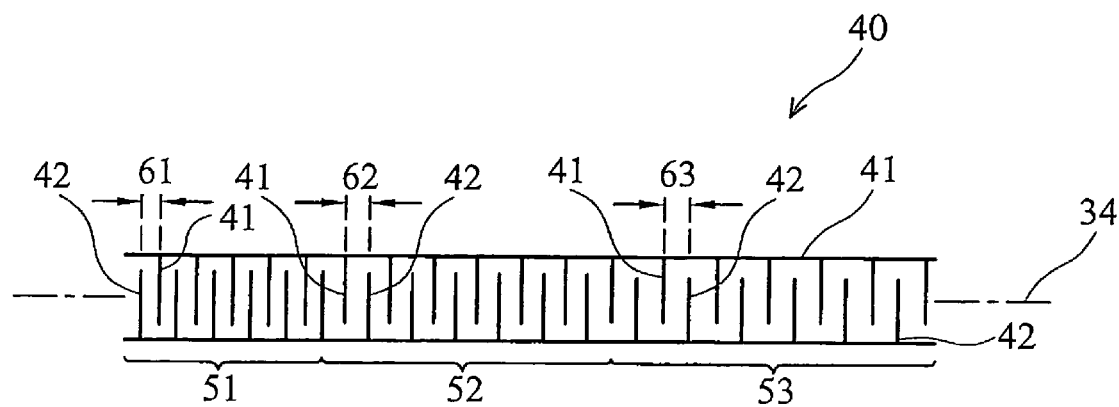
FIG. 2 is a plan view of a comb-comb TDDB test pattern of a test structure in accordance with a first illustrative embodiment of the present invention.

FIG. 2 shows a comb-comb TDDB test pattern 40 of a test structure in accordance with a first illustrative embodiment of the present invention. FIG. 2 is a plan view of the TDDB test pattern 40. Part of a first conductive line 41 of the test pattern 40 (i.e., the portion shown; probe contacts not shown) is generally comb shaped in the plan view of the test pattern 40 (see FIG. 2). Part of a second conductive line 42 of the test pattern 40 is also generally comb shaped in the plan view of the test pattern 40. The first conductive line 41 is interleaved or interdigitated with the second conductive line 42, as shown in FIG. 2. Hence, the TDDB test pattern 40 of FIG. 2 has a capacitor structure.

The first and second conductive lines 41, 42 are formed in a dielectric material on a wafer (i.e., same dielectric material used in the integrated circuit chips, but at a different location on the wafer). The test structure that includes the TDDB test pattern 40 of FIG. 2 may formed in any suitable or any desirable location on the wafer (e.g., kerf region of a chip, between chips, active region of a chip, bond pad region of a chip), but is preferably formed in the same dielectric material as that used in the active regions of the integrated circuit chips (e.g., same low-k dielectric material used in a IMD region). The dielectric material may be any suitable dielectric material, any currently used dielectric material, or any later developed dielectric material used in integrated circuit chips, including (but not limited to): low-k dielectric material, high-k dielectric material, silicon dioxide, silicon nitride, silicon oxynitride, silicon carbon, and combinations thereof, for example. The first and second conductive lines 41, 42 are preferably formed from the same conductive material as that used in the active regions of the integrated circuit chips. The first and second conductive lines 41, 42 may be any suitable conductive material, any currently used conductive material, or any later developed conductive material used in integrated circuit chips, including (but not limited to): metal, doped polysilicon, silicide, copper, aluminum, tungsten, and combinations thereof, for example. Although not necessary, preferably the TDDB test pattern 40 is formed simultaneously with the formation of a dielectric and a conductive line region of an active region of the integrated circuit chips (e.g., an IMD level), and using conductive line dimensions and spacing dimension similar to those in the active regions. By doing so, the test structure can simulate the characteristics of the dielectric material at the active regions of the chips and provide an indicator of the quality of the chips on that wafer.

As shown in FIG. 2, the TDDB test pattern 40 of the first embodiment has three portions (51, 52, and 53) extending along a longitudinal axis 34 of the test pattern 40 in the plan view of the test pattern 40. The second portion 52 is adjacent to and different from the first portion 51. Likewise, the third portion 53 is adjacent to and different from the second portion 52. At the first portion 51 of the test pattern 40, the first conductive line 41 and the second conductive line 42 are separated by a first minimum distance 61. At the second portion 52 of the test pattern 40, the first conductive line 41 and the second conductive line 42 are separated by a second minimum distance 62, and the second minimum distance 62 is greater than the first minimum distance 61. And at the third portion 53 of the test pattern 40, the first conductive line 41 and the second conductive line 42 are separated by a third minimum distance 63, and the third minimum distance 63 is greater than the second minimum distance 62. Although the first illustrative embodiment has three portions 51, 52, and 53 (with three different minimum spacings 61, 62, and 63), there may be two or more than three portions in other embodiments of the present invention.

Figure 3:
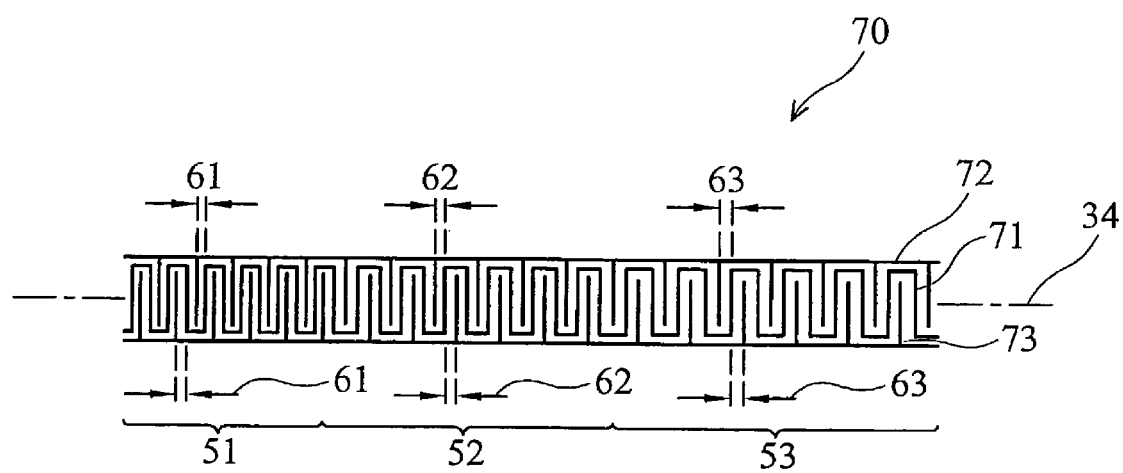
FIG. 3 is a plan view of a comb-serpent TDDB test pattern of a test structure in accordance with a second illustrative embodiment of the present invention.

FIG. 3 is a plan view of a comb-serpent TDDB test pattern 70 of a test structure in accordance with a second illustrative embodiment of the present invention. The test pattern 70 of the second embodiment has a central conductive line 71, an upper conductive line 72, and a lower conductive line 73. Part of the central conductive line 71 of the test pattern 70 (i.e., the portion shown; probe contacts not shown) is generally serpent shaped or generally square-wave shaped in the plan view of the test pattern 70 (see FIG. 3). Part of the upper conductive line 72 of the test pattern 70 (i.e., the portion shown; probe contacts not shown) is generally comb shaped in the plan view of the test pattern 70. And, part of the lower conductive line 73 of the test pattern 70 (i.e., the portion shown; probe contacts not shown) is also generally comb shaped in the plan view of the test pattern 70, as shown in FIG. 3. The upper conductive line 72 is interleaved with the central conductive line 71. Likewise, the lower conductive line 73 is also interleaved with the central conductive line 71. Hence, the TDDB test pattern 70 of FIG. 3 has a differential capacitor structure.

The conductive lines 71, 72, and 73 of the TDDB test pattern 70 are formed in a dielectric material on a wafer (i.e., same dielectric material used in the integrated circuit chips, but at a different location on the wafer). The test structure that includes the TDDB test pattern 70 of FIG. 3 may formed in any suitable or any desirable location on the wafer (e.g., kerf region of a chip, between chips, active region of a chip, bond pad region of a chip), but is preferably formed in the same dielectric material as that used in the active regions of the integrated circuit chips (e.g., same low-k dielectric material used in a IMD region). The dielectric material may be any suitable dielectric material, any currently used dielectric material, or any later developed dielectric material used in integrated circuit chips, including (but not limited to): low-k dielectric material, high-k dielectric material, silicon dioxide, silicon nitride, silicon oxynitride, silicon carbon, and combinations thereof, for example. The conductive lines 71, 72, and 73 are preferably formed from the same conductive material as that used in the active regions of the integrated circuit chips. The conductive lines 71, 72, and 73 may be any suitable conductive material, any currently used conductive material, or any later developed conductive material used in integrated circuit chips, including (but not limited to): metal, doped polysilicon, silicide, copper, aluminum, tungsten, and combinations thereof, for example. Although not necessary, preferably the TDDB test pattern 70 is formed simultaneously with the formation of a dielectric and conductive line region of an active region of the integrated circuit chips (e.g., an IMD level), and using conductive line dimensions and spacing dimension similar to those in the active regions. By doing so, the test structure can simulate the characteristics of the dielectric material at the active regions of the chips and provide an indicator of the quality of the chips on that wafer.

As shown in FIG. 3, the TDDB test pattern 70 of the second embodiment has three portions 51, 52, and 53 extending along a longitudinal axis 34 of the test pattern 70 in the plan view of the test pattern 70. The second portion 52 is adjacent to and different from the first portion 51. Likewise, the third portion 53 is adjacent to and different from the second portion 52. At the first portion 51 of the test pattern 70, the upper conductive line 72 and the central conductive line 71 are separated by a first minimum distance 61. Similarly, the lower conductive line 73 and the central conductive line 71 are separated by the first minimum distance 61 at the first portion 51 of the test pattern 70 as well. At the second portion 52 of the test pattern 70, the upper conductive line 72 and the central conductive line 71 are separated by a second minimum distance 62, and the second minimum distance 62 is greater than the first minimum distance 61. Likewise, the lower conductive line 73 and the central conductive line 71 are separated by the second minimum distance 62 at the second portion 52 of the test pattern 70. And at the third portion 53 of the test pattern 70, the upper conductive line 72 and the central conductive line 71 are separated by a third minimum distance 63, and the third minimum distance 63 is greater than the second minimum distance 62. The lower conductive line 73 and the central conductive line 71 are separated by the third minimum distance 63 at the third portion 53 of the test pattern 70. Although the second illustrative embodiment has three portions 51, 52, and 53 (with three different minimum spacings 61, 62, and 63), there may be two or more than three portions in other embodiments of the present invention.

Figure 4:
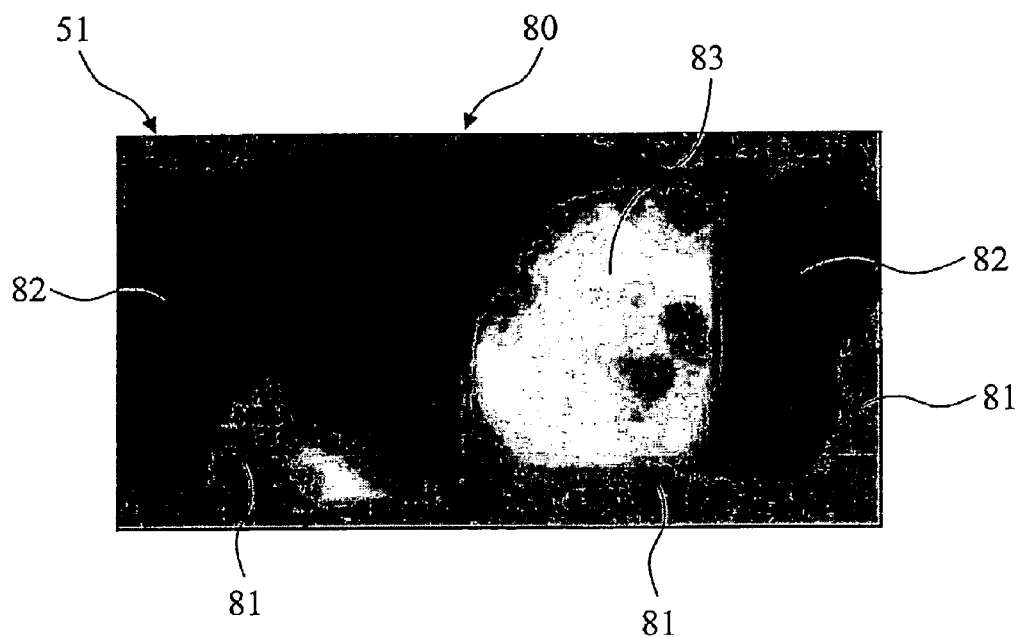
FIG. 4 shows a cross-section image of a burned out portion of a test structure in accordance with the second embodiment after a dielectric breakdown test at a first portion of the TDDB test pattern.

During a typical TDDB test using a device under testing (DUT), the result of the test is a burned-out portion of the device where the dielectric material broke down causing a short between adjacent electrodes of the DUT. This short that causes the burned-out portion to form typical damages a relatively large area at and surrounding the point of initial failure. Although the time to dielectric breakdown can be measured accurately, the failure mode and characteristics of the failure is usually unobservable due to the large damage area. This is illustrated in FIG. 4, which shows a cross-section image of an actual burned-out portion 80 resulting from a TDDB test of a dielectric material 82. Note that much of the conductive lines 81 at the burned-out portion 80 is melted away and the failure region 83 is quite large relative to the size of the conductive lines 81 and the spacing between lines. A need exists for a way to measure the time to failure while also providing a way to observe the failure mode and failure characteristics. It is difficult to observe anything more than the time to failure from this burned-out portion 80 shown in FIG. 4. As part of the failure analysis, it is also important to observe the mechanism or process of the failure, and the failure mode. Using a conventional TDDB test pattern (see e.g., FIGS. 1A and 1B), each test structure may only be used for either a TDDB test, which results in a serious burned-out portion (as shown in FIG. 4), or it may be brought only close to failure, which does provide the time to breakdown information.

But using an embodiment of the present invention (see e.g., FIGS. 2 and 3), one test structure and one TDDB test may be used to provide both the time to dielectric breakdown ($t_{bd}$) and observable failure modes and failure characteristics of the dielectric breakdown. An embodiment of the present invention has a first portion (51) with a first minimum spacing (61) between conductive lines and a second portion (52) with a second larger minimum spacing (62) between conductive lines (and perhaps additional portions as well). During a TDDB test using an embodiment of the present invention, the dielectric material will first breakdown somewhere at the first portion (51) because the first minimum spacing (61) in the first portion is smaller than that of the other portions. When the dielectric material breaks down at the first portion, it will typically form a relatively large burned-out portion (80), like that shown in FIG. 4, but it will provide the time-to-dielectric-breakdown measurement. Simultaneously, at the second portion (52) of the TDDB test pattern of an embodiment (and/or perhaps at a third or fourth portion), the dielectric breakdown is at an initial stage or beginning stage of full breakdown.

Figure 5:
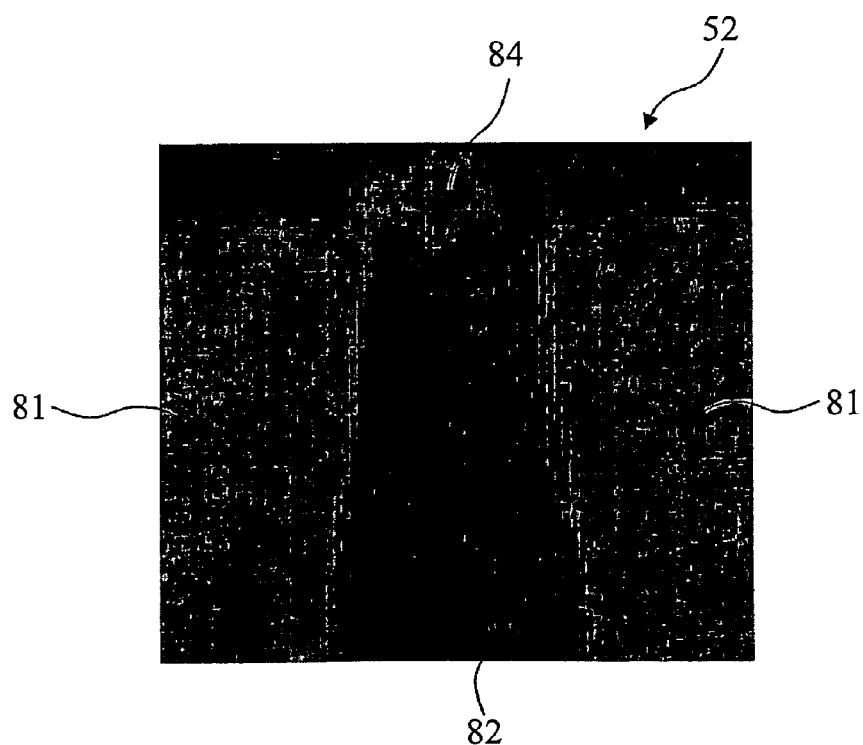
FIG. 5 shows a cross-section image of a second portion of the test structure of FIG. 4 illustrating a partial dielectric breakdown at an initial stage of dielectric breakdown.

FIG. 4 shows a cross-section image at a first portion (51) of a test structure having a TDDB test pattern in accordance with an embodiment of the present invention (e.g., FIG. 3). FIG. 5 shows a cross-section image at a second portion (52) of the test structure of FIG. 4 illustrating a partial dielectric breakdown (see region 84 in FIG. 5) at an initial stage of dielectric breakdown. Thus, using a space-dependent IMD test structure in accordance with an embodiment of the present invention, the failure mode and failure mechanism occurring in the dielectric material can be observed, while also performing a TDDB test using the same test device (same DUT). This saves time in testing because one test process using one test device can provide the same information that would normally require multiple tests using multiple test devices. Using an embodiment of the present invention may also allow the probe device (used to make electrical connection to the contacts of the test devices) to be less complex and/or have fewer probes because fewer test devices and fewer test processes will be needed to obtain TDDB test results and failure analysis of the test devices (observing the failure modes). Furthermore, using an embodiment of the present invention may save valuable wafer real estate because one test device can provide the results previously provided by multiple test devices. Saving wafer real estate may lead to greater wafer yield (i.e., more chips per wafer), which leads to higher profits for production. Also, other test methodologies (e.g., dual ramp TDDB testing) may be implemented using an embodiment of the present invention to provide other test results as well, or in alternative. With the benefit of this disclosure, one of ordinary skill in the art may realize other uses and applications of an embodiment of the present invention, without departing from the spirit and scope of the present invention.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A test structure comprising a time dependent dielectric breakdown (TDDB) test pattern formed in a dielectric material on a wafer, the TDDB test pattern comprising:

a first conductive line formed in the dielectric material; and
a second conductive line formed in the dielectric material adjacent to the first conductive line,
wherein the first conductive line and the second conductive line are separated by a first minimum distance at a first portion of the TDDB test pattern, and
wherein the first conductive line and the second conductive line are separated by a second minimum distance at a second portion of the TDDB test pattern, the second minimum distance being greater than the first minimum distance, and the second portion being different than the first portion.

2. The test structure of claim 1, wherein the first conductive line and the second conductive line are separated by a third minimum distance at a third portion of the TDDB test pattern, the third minimum distance being greater than the second minimum distance, and the third portion being different than the first and second portions.

3. The test structure of claim 2,
wherein at least part of the first conductive line is a central conductive line that is generally square-wave shaped in a plan view of the TDDB test pattern;
wherein at least part of the second conductive line is an upper conductive line that is located above the central conductive line in the plan view of the TDDB test pattern, the upper conductive line being generally comb shaped in the plan view of the TDDB test pattern, such that the upper conductive line is interleaved with the central conductive line;
wherein the upper conductive line and the central conductive line are separated by the first minimum distance at the first portion of the TDDB test pattern;
wherein the first portion extends along a longitudinal axis of the TDDB test pattern in the plan view of the TDDB test pattern;
wherein the upper conductive line and the central conductive line are separated by the second minimum distance at the second portion of the TDDB test pattern;
wherein the second portion extends along the longitudinal axis of the TDDB test pattern adjacent the first portion in the plan view of the TDDB test pattern;
wherein the upper conductive line and the central conductive line are separated by the third minimum distance at the third portion of the TDDB test pattern; and
wherein the third portion extends along the longitudinal axis of the TDDB test pattern adjacent the second portion in the plan view of the TDDB test pattern.

4. The test structure of claim 3, further comprising a lower conductive line formed in the dielectric material adjacent to the central conductive line and located below the central conductive line in the plan view of the TDDB test pattern, the lower conductive line being generally comb shaped in the plan view of the TDDB test pattern, such that the lower conductive line is interleaved with the central conductive line;
wherein the lower conductive line and the central conductive line are separated by the first minimum distance at the first portion of the TDDB test pattern;
wherein the lower conductive line and the central conductive line are separated by the second minimum distance at the second portion of the TDDB test pattern; and
wherein the lower conductive line and the central conductive line are separated by the third minimum distance at the third portion of the TDDB test pattern.

5. The test structure of claim 2,
wherein at least part of the first conductive line is generally comb shaped in a plan view of the TDDB test pattern,
wherein at least part of the second conductive line is generally comb shaped in the plan view of the TDDB test pattern,
wherein the first conductive line is interleaved with the second conductive line;
wherein the first portion extends along a longitudinal axis of the TDDB test pattern in the plan view of the TDDB test pattern;
wherein the second portion extends along the longitudinal axis of the TDDB test pattern adjacent the first portion in the plan view of the TDDB test pattern; and
wherein the third portion extends along the longitudinal axis of the TDDB test pattern adjacent the second portion in the plan view of the TDDB test pattern.

6. A method of performing a TDDB test using the test structure of claim 2, the method comprising:
applying a constant voltage over the TDDB test pattern until dielectric breakdown occurs in the dielectric material at the first portion of the TDDB test pattern;
observing the dielectric material at the second portion of the TDDB test pattern to determine a second portion dielectric breakdown location between the first conductive line and the second conductive line at the second portion of the TDDB test pattern where dielectric breakdown begins to occur in the second portion; and
observing the dielectric material at the third portion of the TDDB test pattern to determine a third portion dielectric breakdown location between the first conductive line and the second conductive line at the third portion of the TDDB test pattern where dielectric breakdown begins to occur in the third portion.

7. The test structure of claim 1, wherein the first and second conductive lines comprise a conductive material selected from the group consisting of metal, doped polysilicon, silicide, copper, aluminum, tungsten, and combinations thereof.

8. The test structure of claim 1, wherein the dielectric material is also part of an intermetal dielectric structure of an integrated circuit chip on the wafer.

9. The test structure of claim 1, wherein the dielectric material comprises a low-k dielectric material.

10. A method of performing a TDDB test using the test structure of claim 1, the method comprising:
applying a constant voltage over the TDDB test pattern until dielectric breakdown occurs in the dielectric material at the first portion of the TDDB test pattern; and
observing the dielectric material at the second portion of the TDDB test pattern to determine a second portion dielectric breakdown location between the first conductive line and the second conductive line at the second portion of the TDDB test pattern where dielectric breakdown begins to occur in the second portion.

11. A test structure comprising a time dependent dielectric breakdown (TDDB) test pattern formed in a dielectric material on a wafer, the TDDB test pattern comprising:
a central conductive line formed in the dielectric material, the central conductive line being generally square-wave shaped in a plan view of the TDDB test pattern;
an upper conductive line formed in the dielectric material adjacent to the central conductive line and located above the central conductive line in the plan view of the TDDB test pattern, the upper conductive line being generally comb shaped in the plan view of the TDDB test pattern, such that the upper conductive line is interleaved with the central conductive line;
a lower conductive line formed in the dielectric material adjacent to the central conductive line and located below the central conductive line in the plan view of the TDDB test pattern, the lower conductive line being generally comb shaped in the plan view of the TDDB test pattern, such that the lower conductive line is interleaved with the central conductive line, wherein the upper conductive line and the central conductive line are separated by a first minimum distance at a first portion of the TDDB test pattern, the first portion extending along a longitudinal axis of the TDDB test pattern in the plan view of the TDDB test pattern, wherein the lower conductive line and the central conductive line are separated by the first minimum distance at the first portion of the TDDB test pattern, wherein the upper conductive line and the central conductive line are separated by a second minimum distance at a second portion of the TDDB test pattern, the second minimum distance being greater than the first minimum distance, the second portion extending along the longitudinal axis of the TDDB test pattern adjacent the first portion in the plan view of the TDDB test pattern, and the second portion being different than the first portion, wherein the lower conductive line and the central conductive line are separated by the second minimum distance at the second portion of the TDDB test pattern.

12. The test structure of claim 11, wherein the upper conductive line and the central conductive line are separated by a third minimum distance at a third portion of the TDDB test pattern, the third minimum distance being greater than the second minimum distance, the third portion extending along the longitudinal axis of the TDDB test pattern adjacent the second portion in the plan view of the TDDB test pattern, the third portion being different than the first and second portions, and wherein the lower conductive line and the central conductive line are separated by the third minimum distance at the third portion of the TDDB test pattern.

13. A method of performing a TDDB test using the test structure of claim 12, the method comprising:

applying a constant voltage over the TDDB test pattern until dielectric breakdown occurs in the dielectric material at the first portion of the TDDB test pattern;

observing the dielectric material at the second portion of the TDDB test pattern to determine a second portion dielectric breakdown location between the first conductive line and the second conductive line at the second portion of the TDDB test pattern where dielectric breakdown begins to occur in the second portion; and observing the dielectric material at the third portion of the TDDB test pattern to determine a third portion dielectric breakdown location between the first conductive line and the second conductive line at the third portion of the TDDB test pattern where dielectric breakdown begins to occur in the third portion.

14. The test structure of claim 11, wherein the first and second conductive lines comprise a conductive material selected from the group consisting of metal, doped polysilicon, silicide, copper, aluminum, tungsten, and combinations thereof.

15. A method of performing a TDDB test using the test structure of claim 11, the method comprising:

applying a constant voltage over the TDDB test pattern until dielectric breakdown occurs in the dielectric material at the first portion of the TDDB test pattern; and observing the dielectric material at the second portion of the TDDB test pattern to determine a second portion dielectric breakdown location between the first conductive line and the second conductive line at the second portion of the TDDB test pattern where dielectric breakdown begins to occur in the second portion.

16. A test structure comprising a time dependent dielectric breakdown (TDDB) test pattern formed in a dielectric material on a wafer, the TDDB test pattern comprising:

a central metal line formed in the dielectric material,
  the central metal line having a square-wave shape extending along a longitudinal axis of the TDDB test pattern in a plan view of the TDDB test pattern,
  the central metal line having laterally extending wave portions, wherein the laterally extending wave portions extend generally perpendicular to the longitudinal axis of the TDDB test pattern in the plan view of the TDDB test pattern;

an upper metal line formed in the dielectric material adjacent to the central metal line and located above the central metal line in the plan view of the TDDB test pattern,
  the upper metal line having a comb shape in the plan view of the TDDB test pattern, and
  the upper metal line having upper comb teeth portions that laterally extend from an upper longitudinal comb frame portion toward the central metal line in the plan view of the TDDB test pattern, such that at least part of the upper comb teeth portions extend between a first group of the laterally extending wave portions of the central metal line;

a lower metal line formed in the dielectric material adjacent to the central metal line and located below the central metal line in the plan view of the TDDB test pattern,
  the lower metal line having a comb shape in the plan view of the TDDB test pattern,
  the lower metal line having lower comb teeth portions that laterally extend from a lower longitudinal comb frame portion toward the central metal line in the plan view of the TDDB test pattern, such that at least part of the lower comb teeth portions extend between a second group of the laterally extending wave portions of the central metal line, wherein the upper comb teeth portions of the upper metal line and the first group of laterally extending wave portions of the central metal line are separated by a first minimum distance at a first portion of the TDDB test pattern, the first portion extending along the longitudinal axis of the TDDB test pattern in the plan view of the TDDB test pattern, wherein the lower comb teeth portions of the lower metal line and the second group of laterally extending wave portions of the central metal line are separated by the first minimum distance at the first portion of the TDDB test pattern, wherein the upper comb teeth portions of the upper metal line and the first group of laterally extending wave portions of the central metal line are separated by a second minimum distance at a second portion of the TDDB test pattern, the second minimum distance being greater than the first minimum distance, the second portion extending along the longitudinal axis of the TDDB test pattern adjacent the first portion in the plan view of the TDDB test pattern, and wherein the lower comb teeth portions of the lower metal line and the second group of laterally extending wave portions of the central metal line are separated by the second minimum distance at the second portion of the TDDB test pattern.

17. The test structure of claim 16,
wherein the upper comb teeth portions of the upper metal line and the first group of laterally extending wave portions of the central metal line are separated by a third minimum distance at a third portion of the TDDB test pattern, the third minimum distance being greater than the second minimum distance, the third portion extending along the longitudinal axis of the TDDB test pattern adjacent the second portion in the plan view of the TDDB test pattern, and
wherein the lower comb teeth portions of the lower metal line and the second group of laterally extending wave portions of the central metal line are separated by the third minimum distance at the third portion of the TDDB test pattern.

18. The test structure of claim 17,
wherein the upper comb teeth portions of the upper metal line and the first group of laterally extending wave portions of the central metal line are separated by a fourth minimum distance at a fourth portion of the TDDB test pattern, the fourth minimum distance being greater than the third minimum distance, the fourth portion extending along the longitudinal axis of the TDDB test pattern adjacent the third portion in the plan view of the TDDB test pattern, and
wherein the lower comb teeth portions of the lower metal line and the second group of laterally extending wave portions of the central metal line are separated by the fourth minimum distance at the fourth portion of the TDDB test pattern.

19. A method of performing a time dependent dielectric breakdown (TDDB) test of a dielectric material of an integrated circuit chip using a test structure comprising a TDDB test pattern formed in the dielectric material, the method comprising:
electrically connecting a test probe to the TDDB test pattern, wherein the TDDB test pattern comprises:
a first conductive line formed in the dielectric material, and
a second conductive line formed in the dielectric material adjacent to the first conductive line, wherein the first conductive line and the second conductive line are separated by a first minimum distance at a first portion of the TDDB test pattern, wherein the first conductive line and the second conductive line are separated by a second minimum distance at a second portion of the TDDB test pattern, the second minimum distance being greater than the first minimum distance, and the second portion being different than the first portion;
applying a constant voltage over the TDDB test pattern until dielectric breakdown occurs in the dielectric material at the first portion of the TDDB test pattern; and
observing the dielectric material at the second portion of the TDDB test pattern to determine a second portion dielectric breakdown location between the first conductive line and the second conductive line at the second portion of the TDDB test pattern where dielectric breakdown begins to occur in the second portion.

20. The method of claim 19 further comprises observing the dielectric material at the third portion of the TDDB test pattern to determine a third portion dielectric breakdown location between the first conductive line and the second conductive line at the third portion of the TDDB test pattern where dielectric breakdown begins to occur in the third portion.

* * * * *